(12) United States Patent
Lee

(10) Patent No.: US 6,883,592 B2
(45) Date of Patent: Apr. 26, 2005

(54) HEATSINK FOR ELECTRONIC COMPONENT

(75) Inventor: Sang-cheol Lee, Kunpo (KR)

(73) Assignee: Zalman Tech Co., Ltd., Kyungki-do (KR)

(*) Notice: Subject to any disclaimer, the term of this patent is extended or adjusted under 35 U.S.C. 154(b) by 43 days.

(21) Appl. No.: 09/982,229

(22) Filed: Oct. 19, 2001

(65) Prior Publication Data

US 2002/0043360 A1 Apr. 18, 2002

Related U.S. Application Data

(63) Continuation-in-part of application No. 09/433,884, filed on Nov. 4, 1999, now abandoned.

(30) Foreign Application Priority Data

Nov. 4, 1998 (KR) .......................................... 1998-47121

(51) Int. Cl.[7] .............................................. H05K 7/20
(52) U.S. Cl. ...................... 165/80.3; 165/185; 361/704
(58) Field of Search ............................... 165/80.3, 185; 361/704, 710, 697; 257/719, 722; 174/16.3

(56) References Cited

U.S. PATENT DOCUMENTS

| | | | |
|---|---|---|---|
| 3,095,037 A | | 6/1963 | Bohm |
| 5,020,586 A | | 6/1991 | Mansingh |
| 5,419,041 A | * | 5/1995 | Ozeki ....................... 29/890.03 |
| 5,419,780 A | | 5/1995 | Suski |
| 5,509,465 A | | 4/1996 | Lai |
| 6,062,301 A | * | 5/2000 | Lu ............................ 165/80.3 |
| D426,196 S | | 6/2000 | Lee |
| D426,814 S | | 6/2000 | Lee |
| 6,076,594 A | | 6/2000 | Kuo |
| 6,289,975 B2 | * | 9/2001 | Kuo .......................... 165/80.3 |
| 6,301,779 B1 | * | 10/2001 | Azar ........................ 29/890.03 |

FOREIGN PATENT DOCUMENTS

| | | |
|---|---|---|
| KR | 1985-0004585 | 7/1985 |
| SU | 1714724 | 2/1992 |

* cited by examiner

Primary Examiner—Allen J. Flanigan
(74) Attorney, Agent, or Firm—Leydig, Voit & Mayer, Ltd.

(57) ABSTRACT

A heatsink for dissipating heat from a heat-generating source such as an electronic component includes heatsink plates, wherein the individual heatsink plates are bound together at a binding portion to form a heat-absorbing portion for contacting a heat-dissipating surface of the electronic component, and portions of the heatsink plates opposite the heat-absorbing surface are separated from each other to collectively act as a heat-dissipating portion binding the heatsink plates together. To provide the separation between heat-dissipating portions of the heatsink plates, the heatsink includes spacers interposed between the binding portions of neighboring heatsink plates or the heatsink plates are spread out apart from each other by being bent at angles. The heatsink plates include fins spaced apart from each other at an interval. The binding element is preferably a rivet. In manufacturing the heatsink, a protrusion is formed at the individual heatsink plates such that the heat dissipating portion of the heatsink is unfolded outward at a angle by the protrusion. The heatsink can transfer the heat generated from a heat-generating source into the surrounding air, without power consumption and without generation of noise and vibrations, and such a heatsink can easily be manufactured.

15 Claims, 13 Drawing Sheets

FIG. 16
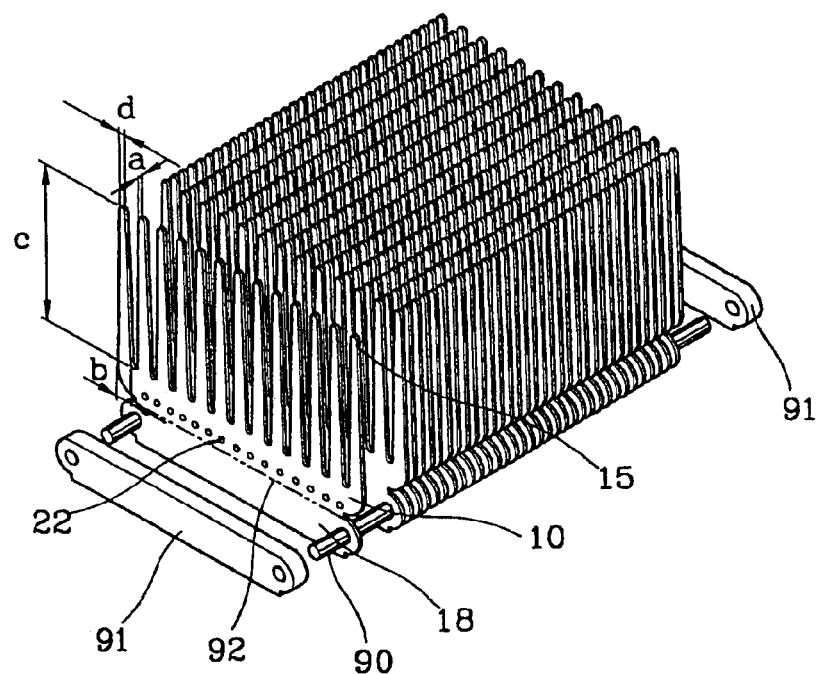
FIG. 17B  FIG. 17A
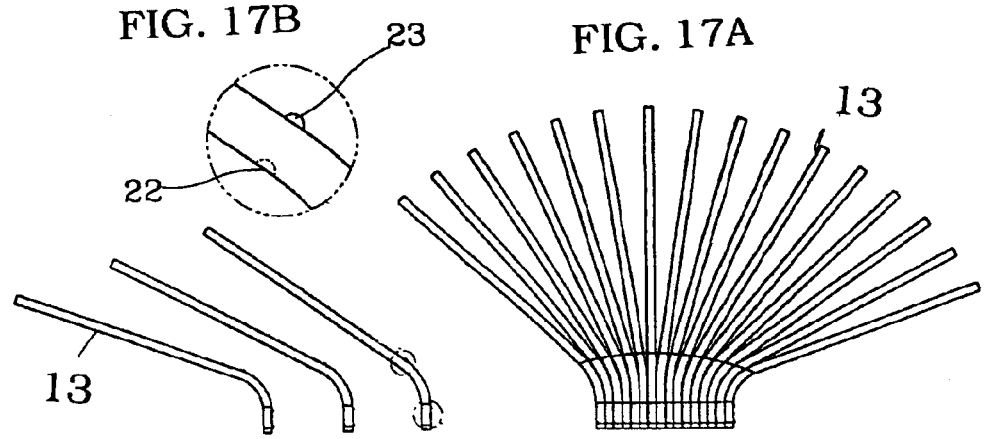
FIG. 17C
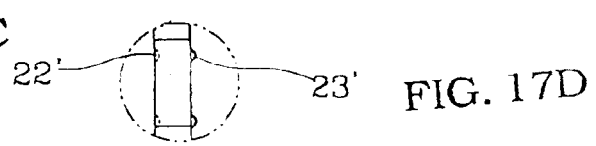
FIG. 17D

HEATSINK FOR ELECTRONIC COMPONENT

This disclosure is a continuation-in-part of U.S. patent application Ser. No. 09/433,884 filed Nov. 4, 1999 now abandoned.

BACKGROUND OF THE INVENTION

1. Field of the Invention

The present invention relates to a heatsink for dissipating heat from electronic components, such as components of a computer system.

2. Description of the Related Art

Central processing units (CPUs), thermoelectric modules, power transistors, video graphics array (VGA) chips, radio frequency chips and the like are examples of electronic components. Since such electronic components produce a large amount of heat during operation, effective cooling is an important concern. If an electronic component is heated over a predetermined temperature, an error may occur in the electronic component, or the electronic component may become damaged. For this reason, heatsinks are installed on such electronic components and dissipate generated heat into the air, thus lowering the temperature of the electronic component.

The ideal heatsink effectively dissipating heat from an electronic component into the air is made of a material having a high thermal conductivity, has a short thermally conductive pathway, a large heat conducting area and a large heat-dissipating area, and allows a smooth air flow near the heat dissipating area. In order to satisfy these requirements, a conventional heatsink is made by extruding an aluminum (Al) alloy and cross-cutting the extrusion, or by die casting Al.

However, these two methods cannot be applied to some materials having a high thermal conductivity, for example, to copper (Cu) which has a higher thermal conductivity than Al alloy. Also, the conventional methods do not provide the heatsink with a sufficiently large heat dissipating area and heat conducting area, and with a short thermally conductive pathway.

U.S. Pat. No. 5,419,780 discloses a heatsink manufactured through extrusion and cross-cutting. Thus, a highly thermally conductive material cannot be used to manufacture the heatsink, and the heat conducting area and heat dissipating area of the heatsink are not large enough for effective heat transfer. Also, the thermally conductive pathway is long.

U.S. Pat. No. 5,509,465 discloses a heatsink in which a plurality of fins having a flange between each fin are overlapped. Although the heatsink has a large heat dissipating area, the heat conducting efficiency is low due to the long thermally conductive pathway, small heat conducting area, and the presence of a heat transfer boundary.

Such conventional heatsinks have high heat resistance and air must be forcibly circulated with the assistance of a fan for more effective heat transfer from the electronic component to the air. For example, in order to appropriately maintain the temperature of a CPU which produces heat at a rate of 15W or more, a fan must be installed near the heatsink mounted on the CPU to lower the heat resistance.

As set forth above, the conventional heatsink requires a fan for appropriate heat dissipation, which has the inherent problems of high power consumption, noises and scattering and sticking of dust. In particular, noise must be eliminated so that the user can work in a quiet environment. Also, with increases in the speed of CPUs, heat generation from CPUs has increased. However, heat generated by CPUs hinders speed increases of CPUs. Thus, the problem associated with the generation of heat in the CPU must be avoided for a high-speed CPU.

SUMMARY OF THE INVENTION

To solve the above problems, an object of the present invention is to provide a heatsink for cooling a heat-generating electronic component, which has a low thermal resistance and does not require a fan, so that cooling of the electronic component is possible without power consumption and without generating noise, and an apparatus and method for effectively manufacturing the heatsink for an electronic component.

One heatsink for an electronic component according to the invention comprises a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at angles, relative to the respective binding portions of the heatsink plates to increase separation between adjacent heat-dissipating portions; and means for binding the plurality of heatsink plates together, wherein the plurality of heat-dissipating fins on each heat-dissipating portion are divided into at least two groups and the groups are separated from each other for mounting of the heatsink on an electronic component with a clip fitting on the electronic component between the groups of fins.

Another heatsink for an electronic component comprises a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at angles relative to the respective binding portions of the heatsink plates to increase separation between adjacent heat-dissipating portions; and means for binding the plurality of heatsink plates together, wherein each heat-dissipating fin in the heat-dissipating portion has a protrusion contacting an adjacent heat-dissipating fin and displacing the heat-dissipating plate from the adjacent heat-dissipating plate.

A further heatsink for an electronic component comprises a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at angles relative to the respective binding portions of the heatsink plates to increase separation between adjacent heat-dissipating portions; and means for binding the plurality of heatsink plates together, wherein each heat-dissipating portion of an individual heatsink plate has one protrusion which contacts an adjacent heat-dissipating plate so that each heat-dissipating plate is displaced at an angle from adjacent heat-dissipating plates in the heatsink.

Yet another heatsink for an electronic component comprises a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at angles relative to the respective binding portions of the heatsink plates to increase separation between adjacent heat-dissipating portions; and means for binding the plurality of heatsink plates together, wherein the binding portions of individual heatsink plates have at least one pair of a protrusion and an indentation which are complementary and engaged with a protrusion and an indentation, respectively, of another heatsink plate for maintaining registration of and preventing distortion of the binding portions.

Still another heatsink for an electronic component comprising a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at angles relative to the respective binding portions of the heatsink plates to increase separation between adjacent heat-dissipating portions; means for binding the plurality of heatsink plates together; and a plurality of spacers, each spacer being interposed between the binding portions of a respective pair of neighboring heatsink plates, wherein the spacers have extensions extending from the plurality of binding portions.

BRIEF DESCRIPTION OF THE DRAWINGS

The above object and advantages of the present invention will become more apparent by describing in detail preferred embodiments thereof with reference to the attached drawings in which:

FIG. 16 is a diagram illustrating a method of manufacturing a heatsink for an electronic component according to the present invention;

FIGS. 17A, 17B, 17C, and 17D are a side view and, three detail views of a heatsink for an electronic component according to the present invention;

DESCRIPTION OF THE PREFERRED EMBODIMENTS

Figure 1:
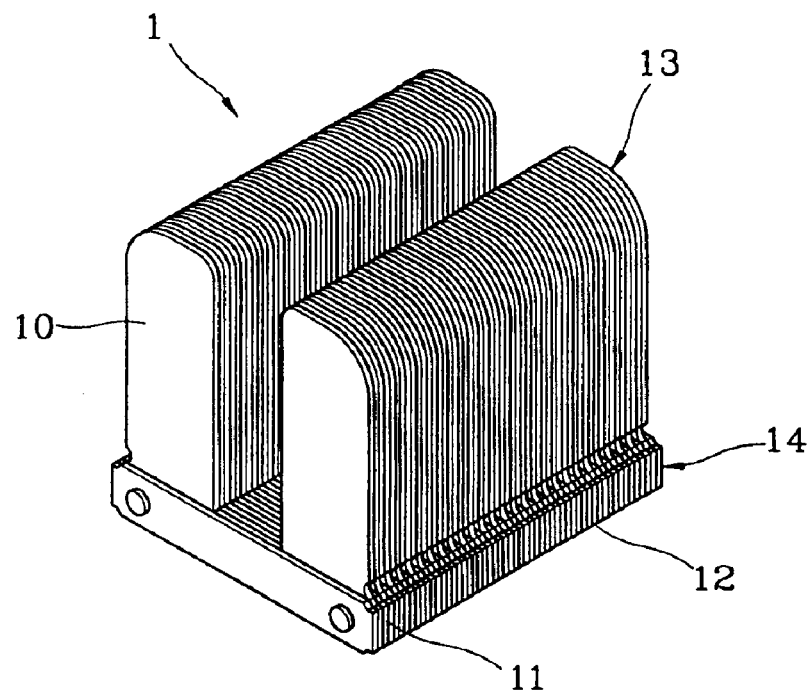
FIG. 1 is a perspective view of a heatsink for an electronic component according to a preferred embodiment of the present invention.

A good heatsink should effectively absorb the heat generated by heat-generating parts without power consumption and without generating noise and vibrations, and transfer the absorbed heat into the surrounding air. Also, the manufacturing process should be easy. That is, a good heatsink is a heatsink capable of keeping the temperature of the heat-generating parts at the lowest level without using a cooling fan, and can be made easily. In addition, by installing a fan capable of forcibly blowing air over and around the heatsink, the heat dissipating efficiency can be further increased.

The technical idea of a heatsink according to the present invention, for satisfying the above conditions, is to manufacture a heatsink through a pressing process, which allows a plurality of heatsink units to be stacked on one another, using aluminum (Al) or copper (Cu) having a high thermal conductivity as the material, such that the thermally conductive pathway can be as short as possible. Also, the technical idea of the heatsink according to the present invention is to maximize the heat conducting area and heat dissipating area, and to allow smooth air flow near the heat dissipating area. Also, the technical idea of the present invention is to provide an easy method of manufacturing such a good heatsink. Throughout the description below, like reference numerals are used to refer to like elements.

Referring to FIG. 1, a heatsink 1 according to the present invention includes a plurality of heatsink plates 10, which are stacked on one another, and spacers 11 interleaved between the heatsink plates 10. The individual heatsink plates 10, between which the spacers 11 are interleaved, are bound together at a binding portion. The binding portion absorbs heat from the electronic component in contact with a heat dissipating surface of the electronic component. The bottom surface of the binding portion forms a heat absorbing portion 12, and the heatsink plates 10 spaced by the spacers 11, form a heat-dissipating portion 13. The heat-absorbing surface 12 is attached to a flat surface of an electronic component (not shown) using a thermally conductive silicone grease (not shown) or an adhesive tape (not shown), to absorb the heat generated by the electronic component, and the heat-dissipating portion 12 dispatches the heat absorbed through the heat-absorbing surface 12 into the air. The air flow becomes better as the thickness of each heatsink plate 10 becomes smaller than that of each spacer 11. Preferably, the heatsink plates 10 are a material having a higher thermal conductivity than that used for the spacers 11. For example, the spacers 11 may be Al, and the individual heatsink plates 10 Cu with a thickness that is half the thickness of each spacer 11. In the case where both the heatsink plates 10 and the spacers 11 are formed of Cu, the heat conducting efficiency increases. However, making the heatsink plates 10 and the spacers 11 of Cu increases the weight of the heatsink 1, which is not desirable.

Figure 2:
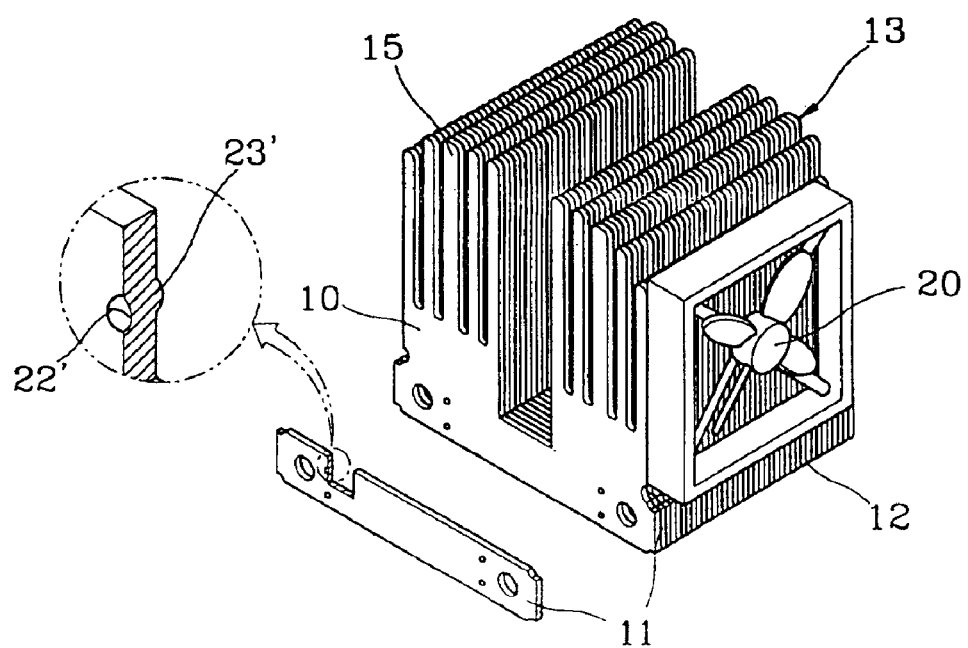
FIG. 2 is a perspective view showing a state in which a fan is installed at the side of a heatsink according to another embodiment of the present invention.

Referring to FIG. 2, the heat dissipating efficiency can be further increased by installing a fan 20 at the side of the heat-dissipating portion 13. Also, a plurality of fins 15 can be formed at the heat-dissipating portion 13 of the individual heatsink plates 10, which contributes to the smooth flow of air, thus increasing the heat-dissipating efficiency. When the fan 20 is installed at a side of the heat-dissipating portion 13, as shown in FIG. 2, the flow of air through the space between the heatsink plates 10 is facilitated, so that the heat-dissipating efficiency increases.

Figure 3:
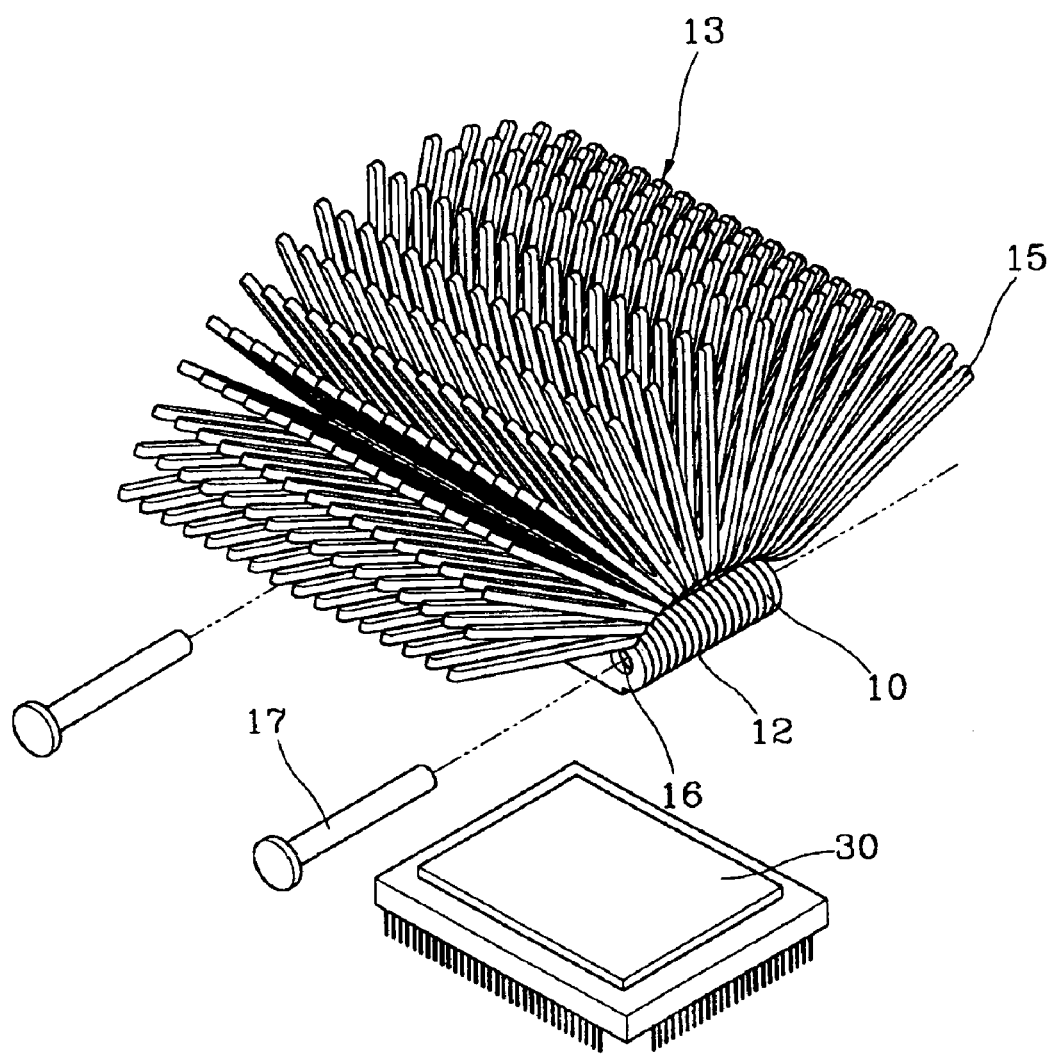
FIG. 3 is a perspective view showing a state in which the heat-dissipating portion of individual heatsink plates of a heatsink according to the present invention are spread outwards.
Figure 4:
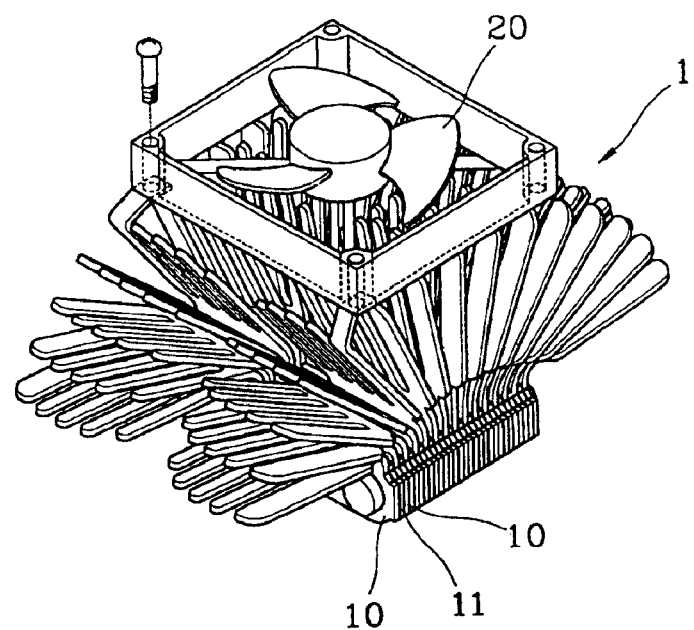
FIG. 4 is a perspective view showing a state in which a fan is fixed to the top of a heatsink according to the present invention.
Figure 5:
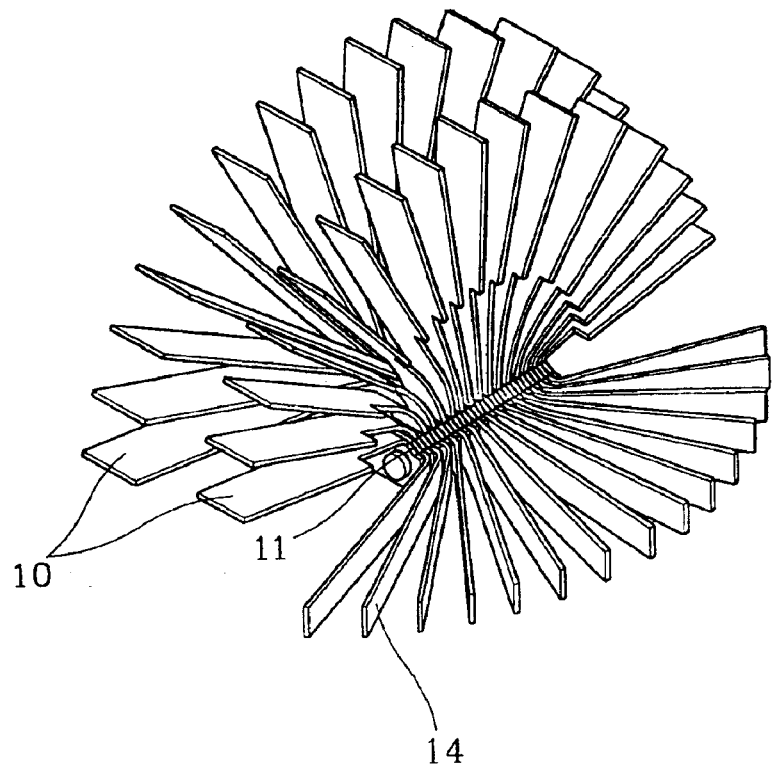
FIG. 5 is a perspective view showing a case in which spacers of a heatsink according to the present invention have side extensions.
Figure 8:
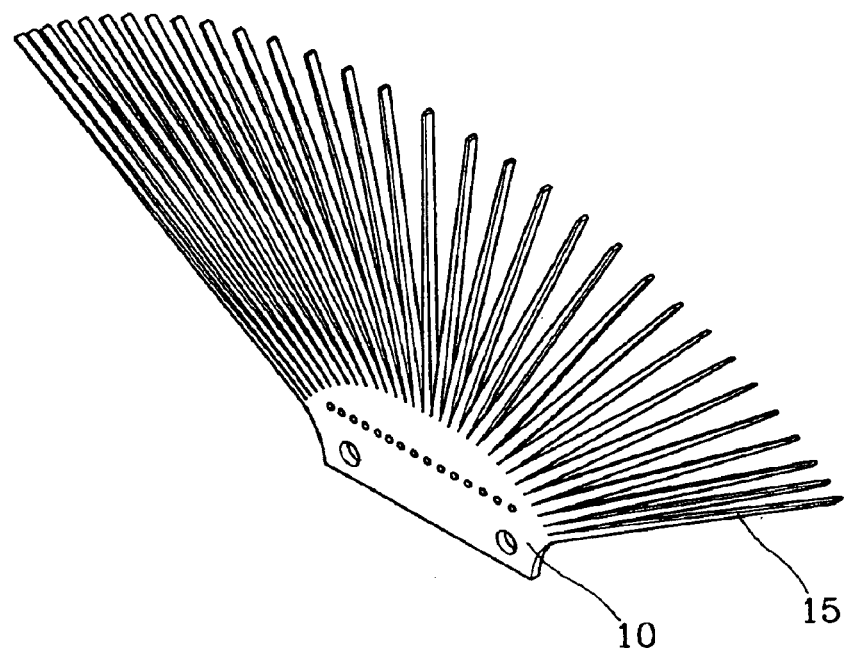
FIG. 8 is a perspective view showing a heatsink plate of a heatsink according to the present invention having fins extending in a radial direction.
Figure 9:
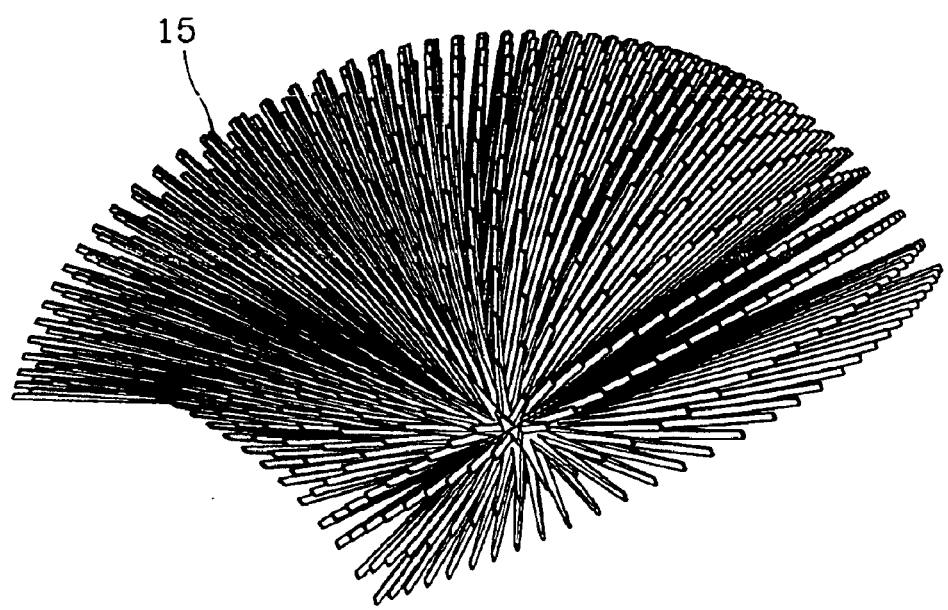
FIG. 9 is a perspective view of a complete heatsink in which the individual heatsink plates shown in FIG. 8 are combined.
Figure 10:
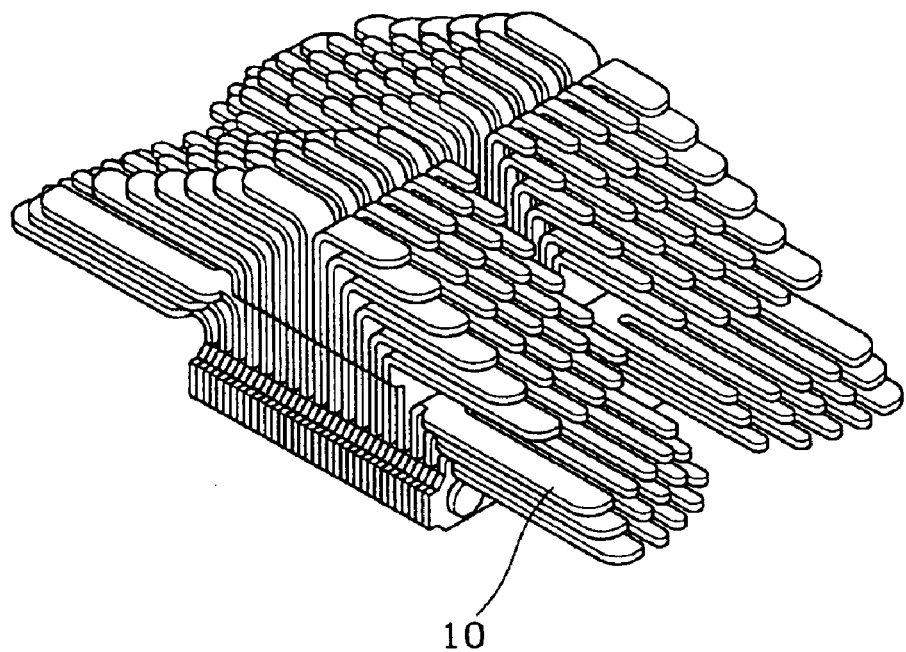
FIG. 10 is a perspective view of a heatsink for an electronic component according to the present invention, having a reduced height.

Referring to FIG. 3, the bottom surfaces of the individual heatsink plates 10 form the heat-absorbing surface 12 which absorbs heat from an electronic component 30, in contact with a heat-dissipating surface of the electronic component 30. Also, the individual heatsink plates 10 have a plurality of fins 15. However, unlike the heatsink shown in FIG. 2, each heatsink plate 10 is bent at an angle. The individual heatsink plates 10 are joined to one another, near the heat-absorbing surface 12, by a rivet 17 as the binding means. In order to reduce the manufacturing cost or to increase the heat-dissipating efficiency, spacers 11 can be inserted between the individual heatsink plates 10 as shown in FIG. 4. In addition, the spacers 11 may have extensions as shown in FIG. 5. As shown in FIG. 8, the heatsink plate 10 may have a sector shape, having fins 15 extending in a radial direction, which allows maximum heat-dissipating efficiency. The assembly of the heatsink plates 10 of FIG. 8 is shown in FIG. 9.

Figure 6:
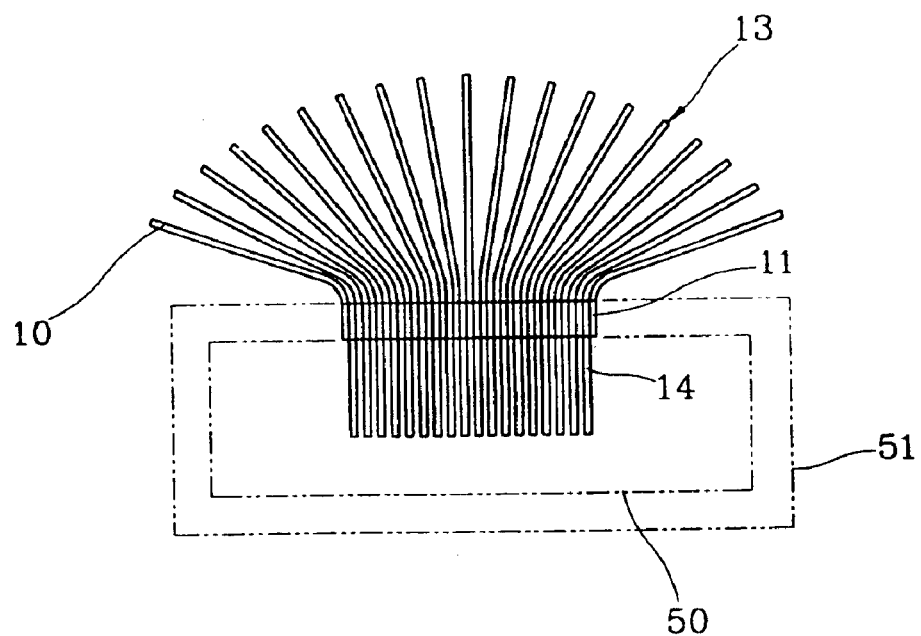
FIG. 6 is a perspective view showing the case where spacers of a heatsink according to the present invention have extensions pointing downward.

Alternatively, as shown in FIG. 6, extensions of the spacers 11 may be directed in a downward direction of the heatsink plates 10, that is, in the opposite direction from the heat-dissipating portion 13 of the heatsink plates 10. Thus, the heat generated from the heat-generating source is transferred to the extensions 14 of the spacers 11 and then dissipated through the heat-dissipating portion 13 of the heatsink plates 10. For example, as shown in FIG. 6, in the case where a hard disk drive 50 is surrounded by a sound insulating member 51 and the extension 24 of the spacers 11 is located in the space formed by the sound insulating member 51, the heat from the hard disk drive 50 is transferred to the extension 24 of the spacers 11. The heat transferred to the extension 24 of the spacers 11 is conducted to the heatsink plates 10 and dissipated through the heat-dissipating portion 13 of the heatsink plate 10.

Figure 7:
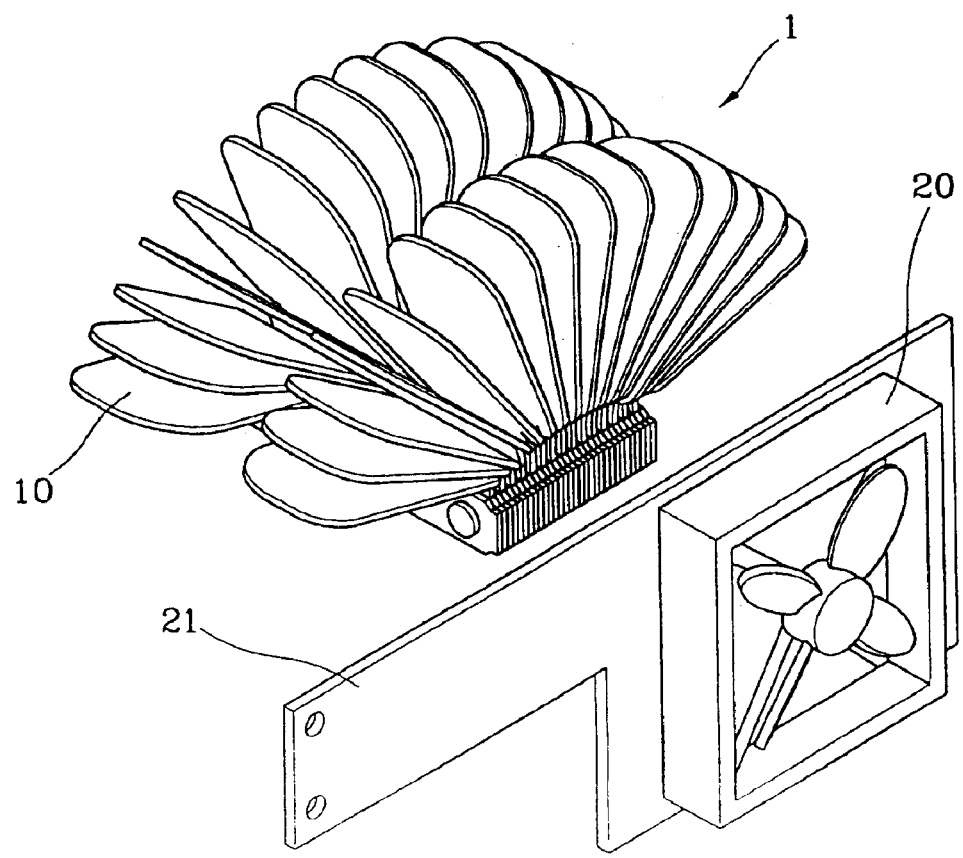
FIG. 7 is a perspective view showing a heatsink having no fins in individual heatsink plate according to the present invention, and a fan fitted to a fan bracket.

The fan 20, which facilitates the flow of air, may be attached to the heatsink 1, as shown in FIG. 4. Alternatively, as shown in FIG. 7, the fan 20 may be installed with a separate fan bracket 21. In the case where such a fan bracket is adopted, the size of the fan 20 can be increased, so that the heat resistance of the heatsink 1 sharply decreases, in addition to lowering the noise generated by the fan 20. When the fan 20 is installed at a side of the heatsink 1, as shown in FIG. 7, it is preferable not to form the fins 15 (see FIG. 8) in the individual heatsink plate 10.

Figure 11:
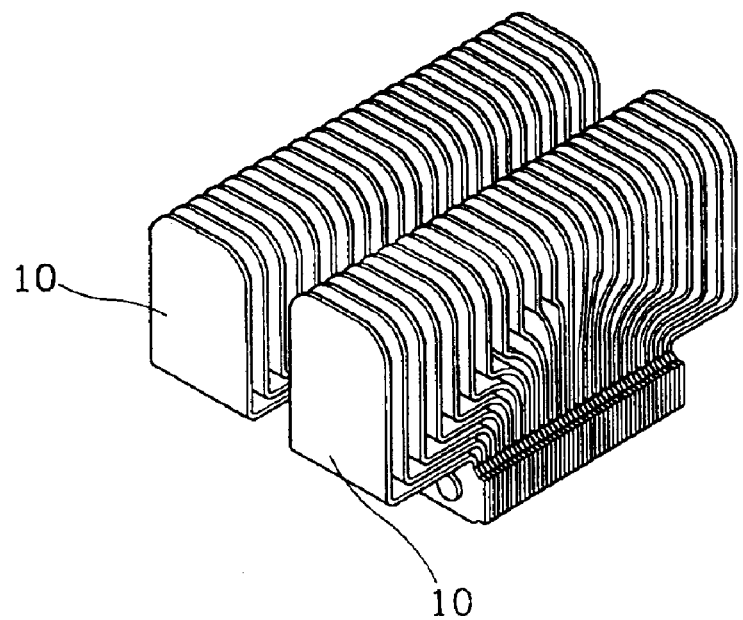
FIG. 11 is a perspective view of a heatsink for an electronic component according to the present invention, having a reduced height and width.

In order to reduce the height of the heatsink 1 as well as to allow smooth flow of air, each heatsink plate 10 may be bent 90° with a different step while the individual heatsink plates 10 are appropriately spaced. Also, to reduce both the height and width of the heatsink 1, each heatsink plate 10 may be bent 90° twice, as shown in FIG. 11. In this case, the individual heatsink plates 10 are spaced apart an appropriate distance for smooth flow of air.

Figure 12:
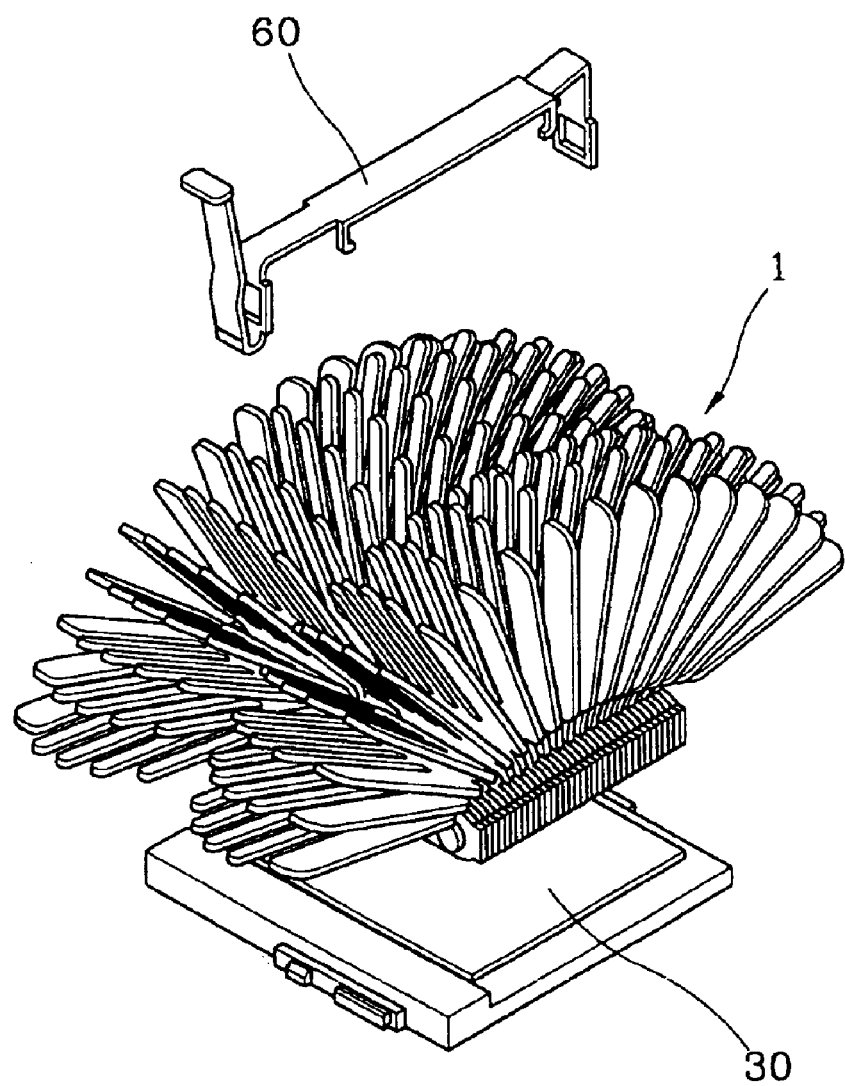
FIG. 12 is a perspective view illustrating the installation of a clip that is used to fix a heatsink according to the present invention to an electronic component.
Figure 13:
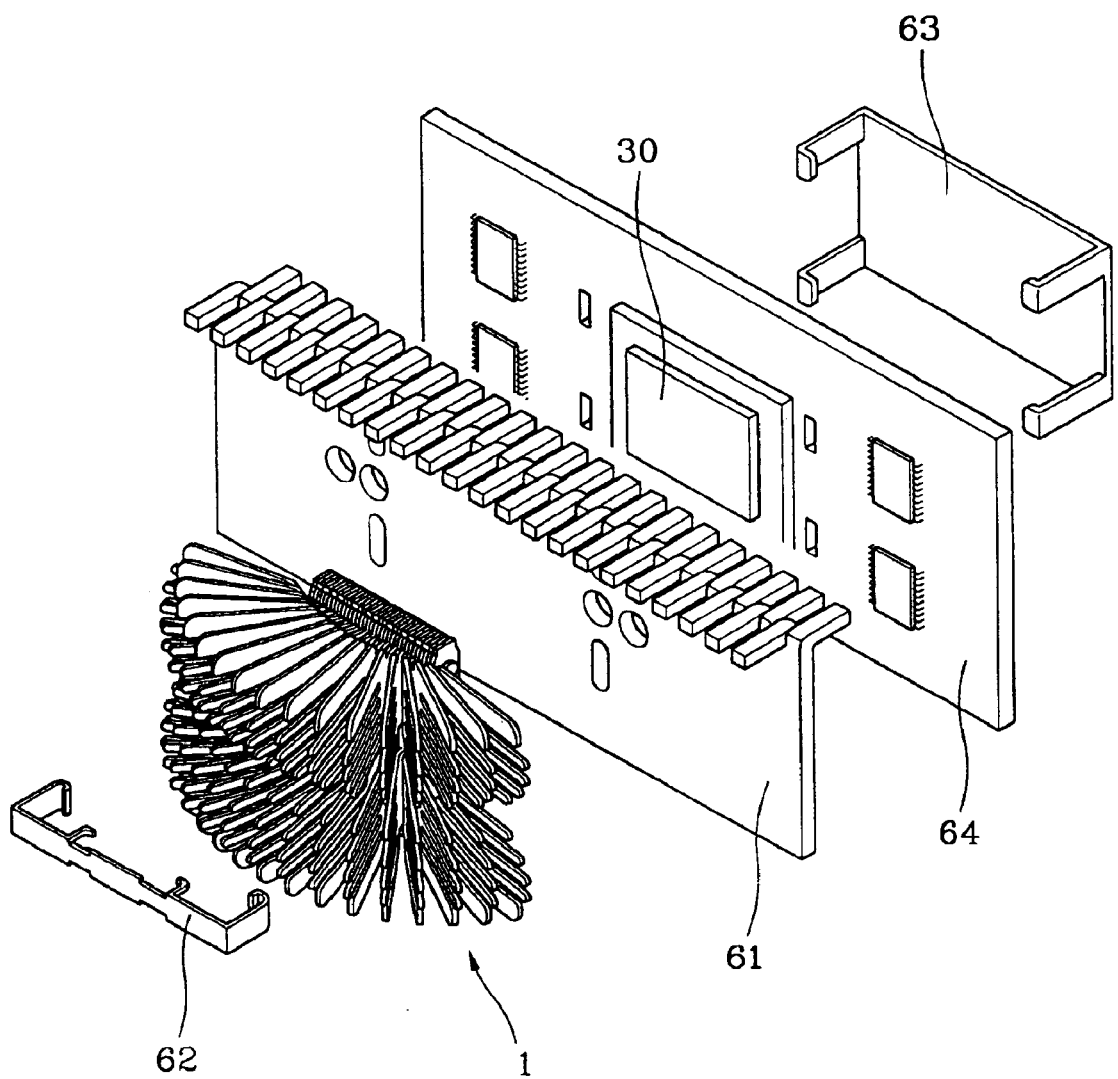
FIG. 13 is a perspective view illustrating the installation of a clip when an auxiliary heat-dissipating plate is interposed between an electronic component to be cooled and a heatsink according to the present invention.

Referring to FIG. 12, the heatsink 1 according to the present invention is attached to the electronic component 30 by means of a bolt (not shown) or a clip 60. Also, a thermally conductive bond (not shown) or a thermally conductive tape (not shown) may be used to fix the heatsink 1 to a heat-generating source. In the case of using the clip 60, preferably, the heatsink 1 is designed such that a portion of the heatsink 1, which the clip 60 is fixed to, has no fins. Also, an auxiliary heat-dissipating plate 61 may be interposed between the heatsink 1 and the electronic component 30, for cooling, as shown in FIG. 13, depending on the type of the heat-producing electronic component. The heatsink 1 is fixed to the auxiliary heat-dissipating plate 61 by a first clip 62, and the auxiliary heat-dissipating plate 61 is fixed to a board 64, which the electronic component 30 has been mounted on, by a second clip 63. The role of the auxiliary heat-dissipating plate 61 is to fix the heatsink 1 to the board 64, and to dissipate heat by itself, thus increasing heat-dissipating efficiency.

A variety of clips can be implemented depending on the type of CPU, which is a heat-generating electronic component. For example, the heatsink 1 may be fixed to a Socket 7 type CPU or a PPGA Socket 370 type CPU by using the clip 60 shown in FIG. 12. Also, preferably, the heatsink 1 can be fixed to a Slot A, Slot 1, or Slot 2 type CPU by using the first and second clips 62 and 63 shown in FIG. 13. The clips 60, 62, and 63 are one-piece clips. Because the clips 60, 62, and 63 are a single body, their manufacturing process is simplified, lowering manufacturing cost, and the likelihood of breakage.

Figure 14:
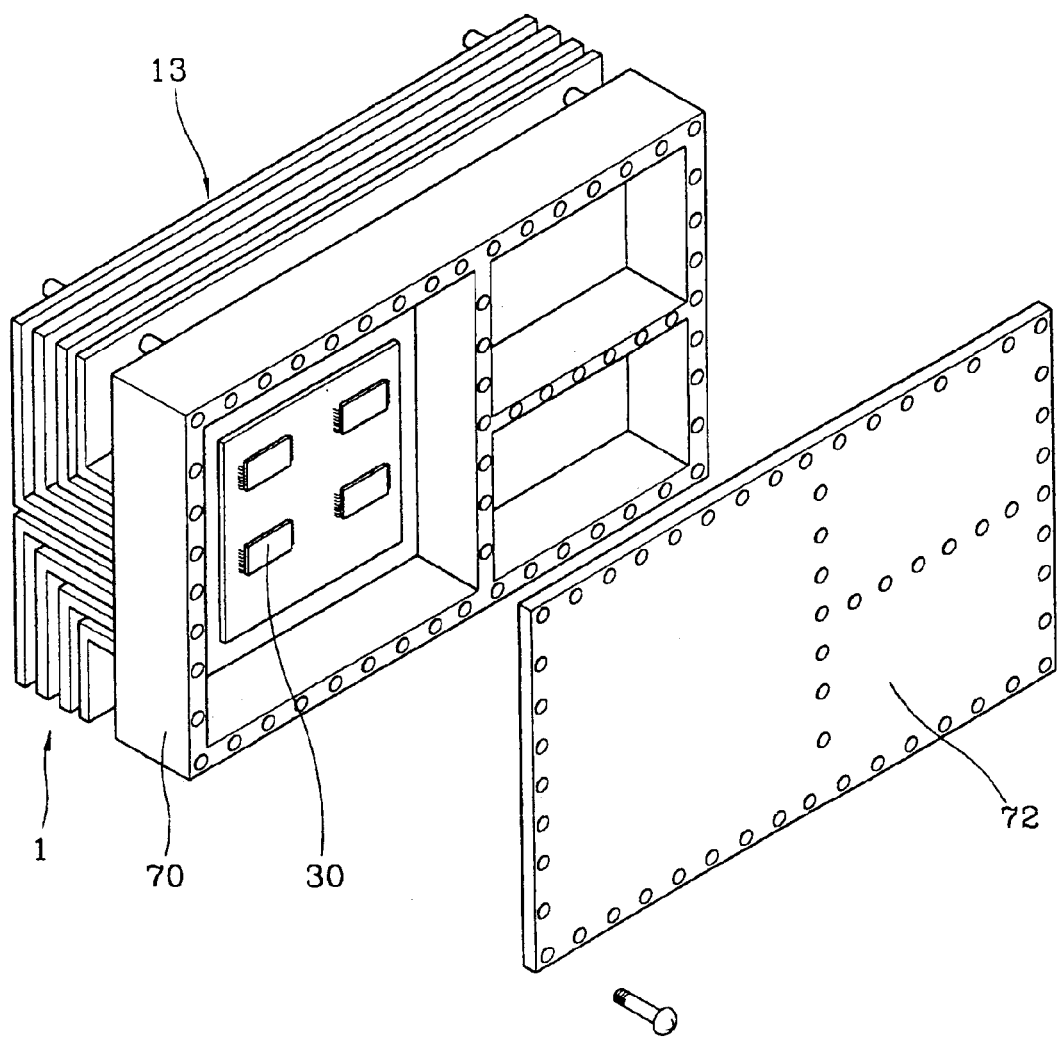
FIG. 14 is a perspective view illustrating a state in which a heatsink for an electronic component according to the present invention is fixed to the electronic component that needs to be shielded from electromagnetic waves.

When the electronic component 30 must be shielded from electro-magnetic waves, as shown in FIG. 14, the electronic component 30 is fixed in a case 70 and covered by a case lid 72. Preferably, the heatsink 1 is installed outside the case 70, such that the heat-absorbing surface of the heatsink 1 contacts the outside of the case 70, to the opposite side of which the electronic component 30 is fixed. The heat generated from the electronic component 30 is transferred by conduction to the case 70, and a small amount of heat conducted to the case 70 is dissipated through the case 70 itself. The remaining heat is additionally conducted to the heatsink 1, which has a large heat conducting area, and dissipated into the air through the heat-dissipating portion 13 of the heatsink 1. Here, the heatsink 1 may be fixed to the case 70 through brazing or by means of a clip (not shown) or a bolt.

Referring to FIGS. 3 and 7, the heatsink 1 is a metal having a high thermal conductivity, such as Cu or Al. Also, the size and the number of heatsink plates 10 and fins 15 in each heatsink plate 10 are determined in view of the amount of heat to be dissipated, whether a fan 20 is to be installed, and the position of the fan 20. When a fan 20 is to be installed at a side of the heatsink 1, it is preferable not to include fins in the individual heatsink plates 10 so that the heat conducting and heat dissipating area is not reduced. For example, in the case of cooling a CPU manufactured by Intel or Advanced Micro Devices (AMD), when the rate of heat dissipation is 5–30 watts, it is preferable that the heat-dissipating area be 300–20,000 cm$^2$. If the heat dissipating area is smaller than 300 cm$^2$, the heat dissipating efficiency is not very good. Meanwhile, if the heat dissipating area is greater than 20,000 cm$^2$, the heat dissipating efficiency is great. However, it is difficult to manufacture a heatsink having such a large heat dissipating area.

Referring to FIG. 16, preferably the thickness a of the fin 15 in the individual heatsink plates 10 is in the range of 0.1–3 mm. If the thickness a of the fin 15 is equal to or less than 0.1 mm, the fins 15 are susceptible to bending, which is not desirable. If the thickness a of the fin 15 is equal to or greater than 3 mm, the heat-dissipating area is reduced and the manufacturing process is difficult. Also, it is preferable that the upper width d of the fin 15 be equal to or less than the lower width b of the fin 15, so that air can flow through and between the fins 15, unhindered. That is, if the upper width d is greater than the lower width b, the fins 15 are apt to bend due to their weight and external forces, thereby hindering air flow. For example, if there are 40 heatsink plates each having a thickness a of 1 mm and each plate has 16 fins with the dimension b=3 mm, c=40 mm, d=2 mm, a=1 mm, wherein c represents the length of the fin, the heat-dissipating area can be appropriately attained and manufacturing of the heatsink can still be achieved with relative ease.

Referring to FIG. 3, the binding means may be one of several well-known techniques. The heatsink plates 10 may be adhered to one another by a chemical adhesive or by lead solder, or through brazing. Alternatively, after forming holes 16 through the heatsink plates 10, the heatsink plates 10 may be combined by using nuts and bolts (not shown). A rivet 17 may also be used as the binding means. Several other binding means, such as, but not limited to, pressure bonding, a heat-conducting bond, and lead solder, may be used. Using the rivet 17 to fix the heatsink plates 10 is most preferred among the above-mentioned binding means. Binding the heatsink plates 10 made of Al with an Al rivet, or binding the heatsink plates 10 made of Cu with a Cu rivet is preferable in view of recycling of resources. Also, using the same material in forming the heatsink plates 10 and rivet 17 contributes to the formation of a well-fitted heatsink, and lowers the manufacturing cost. The above-mentioned binding means does not hinder heat absorption from the heat-generating source by the heatsink. This is because the bottom surface of each heatsink plate 10 directly contacts the heat-generating source. In consideration of the possibility that the heatsink plates 10 may not directly contact the heat-generating source, the heatsink plates 10 made of Al may be fixed by the rivets 17 made of Cu, to facilitate heat conduction through the rivets 17 made of Cu having a high thermal conductivity. Also, as shown in FIG. 2, indentations 22' and protrusions 23' may be formed in the heatsink plates 10, which can prevent distortion of the heat-absorbing portion. If the heat-absorbing portion is distorted, the bottom surface of the individual heatsink plates 10 becomes uneven, so that the heat absorption efficiency through the heat-absorbing surface from a heat-generating electronic component decreases. Here, the shapes of indentations 22' and protrusions 23' are substantially complementary.

Figure 15:
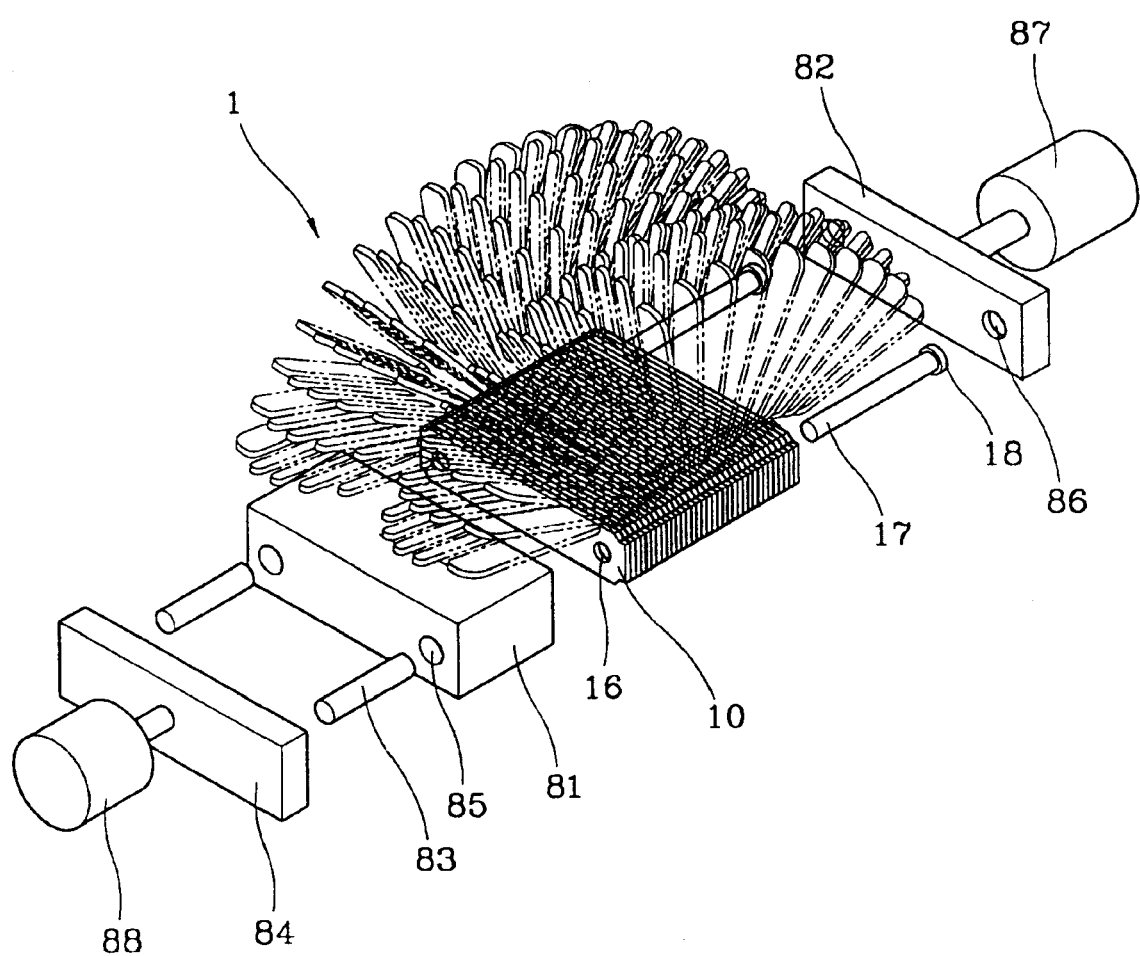
FIG. 15 is an exploded perspective view of a riveting device that is used to combine the binding portion of individual heatsink plates for an electronic component according to the present invention using rivets.

Referring to FIG. 15, when binding the heatsink plates 10 using the rivets 17, preferably, a riveting device is used. That is, the riveting device is required to tightly fix the individual heatsink plates 10 and to shape uniform heads 18 of the rivets 17. The riveting device includes a first jig 81, a second jig 82, a hammer 84, and pin hammers 83. The first jig 81 has holes for receiving the pin hammers 83, and the second jig 82 has holes 86 for receiving each head 18 of the rivet 17. The first jig 81 is supported by a support (not shown) and the second jig 82 is connected to a compression cylinder 88. The hammer 84 is connected to the hammer cylinder 88 that compresses the pin hammer 83.

In riveting the individual heatsink plates 10 using the riveting device, the rivets 17 are inserted into the holes 16 of the heatsink plates 10, and the binding portion of the heatsink plates 10, where the holes 16 are located, is placed between the first and second jigs 81 and 82. As the compression cylinder 87 is operated by a controller (not shown), the second jig 82 compresses the binding portion of the heatsink plates 10 against the first jig 81. The heads 18 of the rivets 17 are inserted into the holes 86, and the ends of the rivets 17, which have passed through the holes 16 in the heatsink plates 10, are inserted into the holes 85 of the first jig 81. As the hammer cylinder 88 operates, the hammer 84 pushes the pin hammers 83 into the holes 85 of the first jig 81, to compress the rivets 17, resulting in the formation of other heads (not shown) at the ends of the rivets 17. Here, the binding portion of the heatsink plates 10 are tightened by the first and second jigs 81 and 82, so that the heatsink plates 10 are hardly deformed. The size of the newly formed rivet heads can be varied by controlling the compression force applied by the hammer cylinder 88. Also, raised or depressed characters may be included on the inner sides of the first and second jigs 81 and 82, which contact the outermost binding portion of the heatsink plates 10, to imprint the corresponding characters on the outermost binding portion of the heatsink 1.

Referring to FIGS. 16 and 17A–17D, the heatsink plates 10 may be manufactured by various methods. For example, a heatsink plate 10 having a predetermined thickness can be formed of Al through pressure molding. Alternatively, a heatsink plate 10 may be formed through etching, wire-cutting, or laser cutting. Then, a plurality of heatsink plates 10, as many as needed to have a desired size, are stacked on one another, and each heatsink plate 10 is then folded at a predetermined angle along a folding line 92. In the case where the heatsink plate 10 is made of an Al plate through molding, preferably, a plurality of heatsink plates 10 are combined after punching indentations 22 into one side of each heatsink plate 10 such that protrusions 23 are formed at the opposite side. After the protrusions 23 are formed in the heatsink plates 10, two assembly rods 90 are inserted into the holes of the heatsink plates 10, and then the binding portions of the individual heatsink plates 10 are brought tightly into contact with each other using jigs 91, such that the individual heatsink plates 10 are bent at an angle along the folding line 92.

Figure 19:
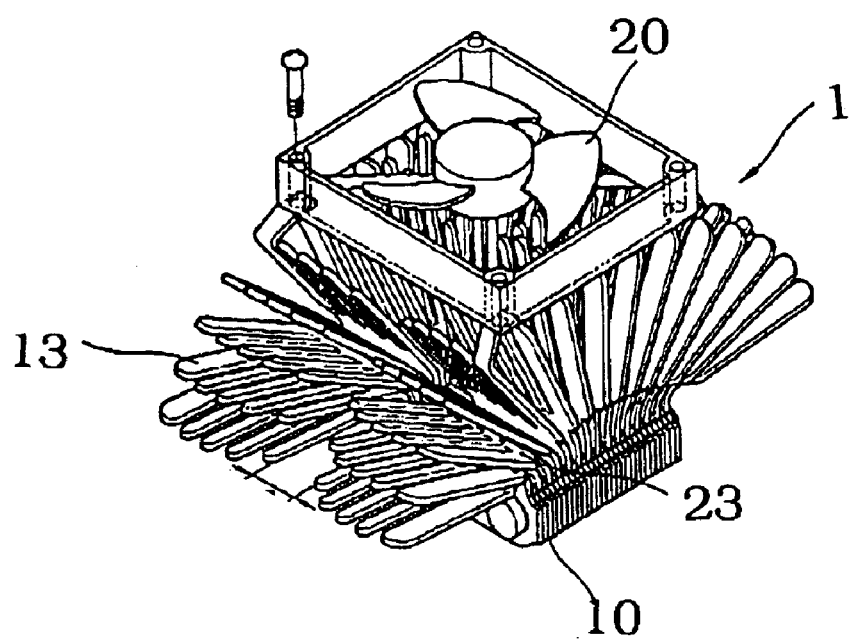
FIG. 19 is a perspective view of heatsink according to the invention with a fan mounted on the heatsink.

As shown in FIGS. 17A, 17B, 17C, and 17D, the folding angle of each heatsink plate 10 can be adjusted based on the shapes and sizes of the indentations 22 and the protrusions 23 on the heat dissipating plates. These indentations 22 and protrusions 23, shown in FIGS. 17B and 17C, may also be used to control spacing between and adjacent plates. As shown in FIG. 17D, the binding portions also include complementary indentations 22' and protrusions 23' to achieve proper registration of the heat dissipating plates during manufacture of the heatsink. FIG. 19 is a perspective view of the heatsink of FIG. 17A with a fan mounted on the heatsink as in the embodiment of FIG. 4.

Figure 18C:
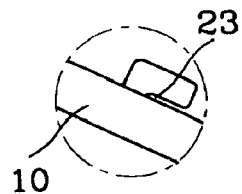
FIGS. 18A, 18B, 18C, and 18D are a side view and three detail views of a heatsink for an electronic component according to the present invention.
Figure 18B:
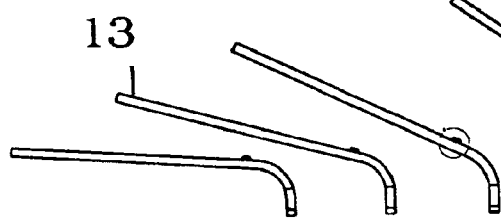
Figure 18A:
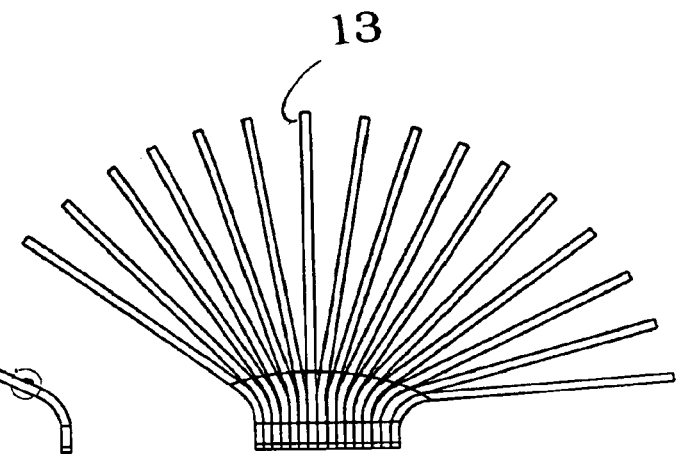
Figure 18D:
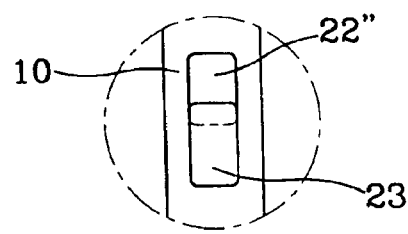

As an alternative, as shown in FIGS. 18A–18D, which show another embodiment of a protrusion on a heat-dissipating fin of a heatsink plate, each heat-dissipating fin may have a protrusion produced by cutting out a portion 22" of the heat-dissipating fin of the heatsink plate 10 by punching, and then folding, i.e., bending, the cut portion 22" to thereby form a protrusion 23". FIG. 18A is a side view of a heatsink with the protrusions, FIG. 18B illustrates several fins of the heatsink with the respective protrusions, FIG. 18D is a front view of the protrusion shown encircled by a dotted line in the detailed side view of the protrusion 23" of FIG. 18C. The protrusion 23" plays the role of a spacer between adjacent heat-dissipating fins, and the heat-dissipating fins are automatically bent during the binding of the individual heatsink plates, and so the individual heatsink plates are shaped like a flower or a hedgehog to increase heat-dissipating capability.

Also, by forming the indentations 22' and the protrusions 23' in the binding portion of the individual heatsink plates 10, which were described previously with reference to FIG. 2, distortion at the binding portion of the heatsink plate 10 can be avoided. Distortion of the binding portion results in an uneven heat-absorbing surface, and thus the heat absorption efficiency of the heat-absorbing surface, from a heat-generating electronic component, is lowered. Because the shapes of the indentations 22' and the protrusions 23' are complementary, unlike the indentations 22 and the protrusion above the folding line 92, the protrusion 23' of a heatsink plate 10 may be pressed into the indentation 22' of the adjacent heatsink plate 10.

As shown in FIGS. 7 and 11, where a heatsink plate 10 is formed by press-molding an Al plate, the plurality of heatsink plates 10 may be combined with each other after being individually bent at different angles. For example, if thirty individual heatsink plates 10 are to be combined, it is only necessary to have fifteen different degrees of bending of the heatsink plates 10 to form the complete heat sink 1. That is, two heatsink plates 10 can be bent at the same angle and one bent heatsink plate 10 can be flipped to be the symmetrical counterpart of the other bent heatsink plate.

When a heatsink is completed, the heat-absorbing surface 12 is leveled through face-cutting. If the heatsink is made of Al, preferably, the Al heatsink is anodized or subjected to an Al-chromate treatment. If Cu is used to form the heatsink, the Cu heatsink is preferably plated or subjected to a Cu-chromate treatment.

The heatsink according to the present invention can be used for various purposes. The heatsink can transfer heat generated by a heat-generating source into air without power consumption and without generating noise and vibrations. Also, the amount of heat to be transferred into air can be increased by using a fan together with the heatsink, although the fan produces noise. Also, in the method for manufacturing the heatsink according to the present invention, the angle between the heatsink plates can be easily controlled to be a constant angle and its manufacturing cost can be kept low with a well-fitted structure.

While the present invention has been illustrated and described with reference to specific embodiments, further modifications and alterations within the spirit and scope of this invention as defined by the appended claims will occur to those skilled in the art.

What is claimed is:

1. A heatsink for an electronic component comprising:
a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at respective angles relative to the respective binding portions of the heatsink plates to increase separation between adjacent heat-dissipating portions; and means for binding the plurality of heatsink plates together, wherein
the plurality of heat-dissipating fins on each heat-dissipating portion are grouped into at least two groups of fins and the groups are separated from each other for mounting of the heatsink on an electronic component with a clip fitting on the electronic component between the groups of the fins, and
each heat-dissipating portion of each heatsink plate has one separating protrusion which contacts the heat-dissipating portion of an adjacent heatsink plate so that the heat-dissipating portion of each heatsink plate is displaced at an angle from the heat-dissipating portions of adjacent heatsink plates.

2. The heatsink of claim 1, wherein the binding portions of individual heatsink plates have at least one pair of a binding protrusion and a binding indentation which are complementary and engaged with a binding indentation and a binding protrusion, respectively, of another heatsink plate for maintaining registration of and preventing distortion of the binding portions.

3. The heatsink of claim 1, comprising a plurality of spacers, each spacer being interposed between the binding portions of a respective pair of neighboring heatsink plates.

4. The heatsink of claim 3, wherein the spacers have extensions extending from the plurality of binding portions.

5. The heatsink of claim 3, wherein the binding portions of the individual heatsink plates and the spacers have at least one pair of a binding protrusion and a binding indentation which are complementary with a binding indentation and a binding protrusion, respectively, of another heatsink plate, for preventing distortion of the binding portions.

6. The heatsink of claim 1, comprising a fan installed at the heatsink to blow air over the heatsink.

7. The heatsink of claim 2, comprising a fan installed at the heatsink to blow air over the heatsink.

8. The heatsink of claim 1, comprising a bracket and a fan fitted to the bracket, to blow air over the heatsink.

9. The heatsink of claim 2, comprising a bracket and a fan fitted to the bracket, to blow air over the heatsink.

10. A heatsink for an electronic component comprising:
a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at respective angles relative to the respective binding portions of the heatsink plates to increase separation between adjacent heat-dissipating portions; and means for binding the plurality of heatsink plates together, wherein each heat-dissipating fin in the heat-dissipating portion of each heatsink plate has a separating protrusion contacting a heat-dissipating fin of a heat-dissipating portion of an adjacent heatsink plate, displacing the heat-dissipating fin from heat-dissipating fins of adjacent heatsink plates.

11. The heatsink of claim 10 wherein the plurality of heat-dissipating fins on each heat-dissipating portion are grouped into at least two groups of fins and the groups are separated from each other for mounting of the heatsink on an electronic component with a clip fitting on the electronic component between the groups of the fins.

12. The heatsink of claim 10, wherein the binding portions of individual heatsink plates have at least one pair of a binding protrusion and a binding indentation which are complementary and engaged with a binding indentation and a binding protrusion, respectively, of another heatsink plate for maintaining registration of and preventing distortion of the binding portions.

13. The heatsink of claim 10, comprising a plurality of spacers, each spacer being interposed between the binding portions of a respective pair of neighboring heatsink plates, wherein the spacers have extensions extending from the plurality of binding portions.

14. The heatsink of claim 13, wherein the binding portions of the individual heatsink plates and the spacers have at least one pair of a binding protrusion and a binding indentation which are complementary with a binding indentation and a binding protrusion, respectively, of another heatsink plate, for preventing distortion of the binding portions.

15. A heatsink for an electronic component comprising:
a plurality of heatsink plates, each of the heatsink plates having a binding portion and a heat-dissipating portion, each heat-dissipating portion including a plurality of heat-dissipating fins joined to the binding portion, wherein the heatsink plates are bound together at the binding portions to form a heat-absorbing portion for contacting a heat-dissipating surface of an electronic component, and at least some of the heat-dissipating portions of the heatsink plates are bent at respective angles relative to the respective binding portions of the heatsink plates to increase separation between adjacent heat-dissipating portions; and
means for binding the plurality of heatsink plates together, wherein each heat-dissipating portion of an individual heatsink plate has a separating protrusion which contacts the heat-dissipating portion of an adjacent heatsink plate so that the heat-dissipating portion of each heatsink plate is displaced at an angle from the heat-dissipating portions of adjacent heatsink plates.

* * * * *